United States Patent
Lewis et al.

(10) Patent No.: US 8,427,213 B2
(45) Date of Patent: Apr. 23, 2013

(54) ROBUST TIME BORROWING PULSE LATCHES

(75) Inventors: David Lewis, Toronto (CA); David Cashman, Toronto (CA); Jeffrey Christopher Chromczak, Brownsville (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/347,626

(22) Filed: Jan. 10, 2012

(65) Prior Publication Data

US 2012/0112791 A1    May 10, 2012

Related U.S. Application Data

(60) Continuation of application No. 12/976,752, filed on Dec. 22, 2010, now Pat. No. 8,115,530, which is a division of application No. 12/060,795, filed on Apr. 1, 2008, now Pat. No. 7,872,512.

(51) Int. Cl.
    *H03K 3/00* (2006.01)
(52) U.S. Cl.
    USPC ............ 327/199; 327/200; 327/291; 327/293
(58) Field of Classification Search .................. 327/199, 327/200, 291, 293
    See application file for complete search history.

(56) References Cited

U.S. PATENT DOCUMENTS

| | | | |
|---|---|---|---|
| 5,742,192 A * | 4/1998 | Banik | 327/166 |
| 6,201,415 B1 | 3/2001 | Manglor | |
| 6,608,513 B2 | 8/2003 | Tschanz et al. | |
| 6,642,765 B2 | 11/2003 | Markovic | |
| 6,806,739 B2 | 10/2004 | Markovic et al. | |
| 6,873,187 B1 | 3/2005 | Andrews et al. | |
| 7,071,754 B2 | 7/2006 | Tahara | |
| 7,088,136 B1 | 8/2006 | Lewis | |
| 7,107,477 B1 * | 9/2006 | Singh et al. | 713/503 |
| 7,872,512 B2 | 1/2011 | Lewis et al. | |

OTHER PUBLICATIONS

U.S. Appl. No. 11/731,125, filed Mar. 30, 2007 Lewis et al.
U.S. Appl. No. 11/715,593, filed Mar. 7, 2007 Boyle et al.
N. Nedovic et al. "A Clock Skew Absorbing Flip-Flop" 2003 IEEE Intternational Solid State Circuits Conference, paper 19.5 (10 pages).
V.G. Oklobdzija, "Clocking and clocked storage elements in a multi-gigahertz environment", IBM J. Res. & Dev. vol. 47 No. 5/6/ Sep./Nov. 2003, pp. 567-583.
V. Stojanovic et al. "Comparative Anaysis of Master-Slave Latches and Flip-Flops for High-Performance and Low-Power Systems," IEEE J. Solid State Circuits, vol. 34, No. 4, Apr. 1999, pp. 536-548.
U.S. Appl. No. 12/976,752, filed Dec. 22, 2010. Lewis et al.

* cited by examiner

*Primary Examiner* — John Poos
(74) *Attorney, Agent, or Firm* — Treyz Law Group; G. Victor Treyz; Nancy Y. Ru

(57) ABSTRACT

Configurable time-borrowing flip-flops may be based on configurable pulse generation circuitry and pulse latches. The circuitry may use a self-timed architecture that controls the width of clock pulses that are generated so that the pulse latches that are controlled by the clock pulses exhibit a reduced risk of race through conditions. Latch circuitry may be provided that is based on a pulse latch and an additional latch connected in series with the pulse latch. In situations in which there is a potential for race through conditions on an integrated circuit, the additional latch may be switched into use to convert the latch circuitry into an edge-triggered flip flop. Clock trees may be provide with configurable shorting structures that help to reduce clock skew. Low-contention clock drivers may drive signals onto the clock tree paths.

18 Claims, 17 Drawing Sheets

ROBUST TIME BORROWING PULSE LATCHES

This application is a continuation of patent application Ser. No. 12/976,752 filed Dec. 22, 2010 now U.S. Pat. No. 8,115, 530, which is a division of patent application Ser. No. 12/060, 795, filed Apr. 1, 2008, now U.S. Pat. No. 7,872,512, which are hereby incorporated by reference herein in their entireties. This application claims the benefit of and claims priority to patent application Ser. No. 12/976,752 filed Dec. 22, 2010, and patent application Ser. No. 12/060,795, filed Apr. 1, 2008, now U.S. Pat. No. 7,872,512.

BACKGROUND

This invention relates to latch circuits in integrated circuits, and more particularly, to configurable time borrowing latch circuits and associated circuitry that may be used to help logic designers improve circuit performance.

Integrated circuits typically contain combinational logic and sequential logic. Combinational logic does not include storage elements. The output of a given combinational logic circuit is therefore determined solely by its present inputs. Sequential logic circuits contain storage elements with outputs that reflect the past sequence of their input values. As a result, the output of a sequential circuit is determined by both its present inputs and by the data stored in its storage elements.

Commonly-used sequential circuit storage elements include level-sensitive latches and flip-flops.

In a level-sensitive latch, the latch output is controlled by the level of a clock (enable) input. When the clock is high, the latch output tracks the value of the input. When the clock transitions from high to low, the output state of the latch is frozen at whatever value was present just prior to the transition. So long as the clock is low, the output of the latch will be maintained in its frozen state.

Flip-flops are edge-triggered devices that change state on the rising or falling edge of an enable signal such as a clock. In a rising-edge-triggered flip-flop, the flip-flop samples its input state only at the rising edge of the clock. This sampled value is then maintained until the next rising edge of the clock.

Flip-flop-based logic circuits are often preferred over latch-based circuits, because the regularity imposed by the edge-triggered properties of flip-flops makes circuit timing behavior relatively straightforward to model and hence simplifies design.

However, in a conventional flip-flop-based logic circuit, the clock frequency must generally be slowed down sufficiently to accommodate the delay associated with the circuit's slowest combinational logic paths. Even if circuitry in a fast logic path produces a valid signal in less time than a slow logic path, that signal is not used until the edge of the next clock pulse. While the regularity imposed by conventional flip-flop circuits is beneficial for ease of circuit design, it tends to limit performance in certain situations.

Time borrowing schemes have been developed to try to address this problem. For example, time borrowing schemes have been developed in which various delays are provided in the clocks feeding the edge triggered flip-flops on a circuit. By selecting appropriate delays for the clocks, a circuit designer can configure a logic circuit so that flip-flops in slower paths have their clock edges delayed. This allows time to be borrowed from fast logic paths and provided to slow logic paths, so that the clock speed for the entire circuit need not be slowed to accommodate worst-case delays.

With these conventional time borrowing schemes, it can be difficult to obtain optimal performance due to the limited number of delays that are available from the clock network. Other such schemes for improving timing performance may have limited applicability or require unacceptably complex analysis. For example, time borrowing flip flops have been developed that provide a fixed and relatively small amount of time borrowing. These schemes cannot provide optimal performance in many circuits.

Moreover, conventional time borrowing schemes may be prone to problems associated with race conditions and clock timing issues.

It would be desirable to be able to provide improved time borrowing circuits to optimize circuit performance on integrated circuits such as programmable logic devices.

SUMMARY

In accordance with the present invention, pulse latches may be provided that serve as configurable time borrowing flip flops. The pulse latches may be clocked using clock pulses. A self-timed pulse generation circuit may be provided to generate the clock pulses. When there is a risk of race through, the pulse generation circuit generates short clock pulses that are able to minimize the risk for race through conditions. When there is no risk of race through, the pulse generation circuit may generate a wider clock pulse to support pulse latch time borrowing operations.

Clock tree structures may be used to distribute clock signals to logic circuits. For example, two separate paths in a clock tree may be used to distribute respective potentially skewed versions of a common clock signal to two physically adjacent logic circuits. To prevent clock skew, a configurable clock tree shorting structure may be used to short the clock distribution paths together. Low-contention clock drivers may be used to prevent shorting current from flowing when the clock distribution paths are shorted together with a configurable clock tree shorting structure.

The pulse latches may be provided with additional latch circuitry. When the pulse latches are used for time borrowing, the additional latch circuitry may be disabled. In situations where there is a risk of race through conditions, the additional latch circuitry may be enabled to convert the pulse latch into an edge-triggered flip flop.

Further features of the invention, its nature and various advantages will be more apparent from the accompanying drawings and the following detailed description of the preferred embodiments.

DETAILED DESCRIPTION

The present invention relates to improving circuit performance in synchronous logic circuits using time borrowing techniques. The logic circuits may be part of any suitable integrated circuits. For example, the logic circuits and time borrowing circuitry of the present invention may be implemented on programmable logic device integrated circuits. If desired, the logic circuits and time borrowing circuitry may be implemented on programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic. The present invention will generally be described in the context of integrated circuits such as programmable logic device integrated circuits as an example.

Figure 1:
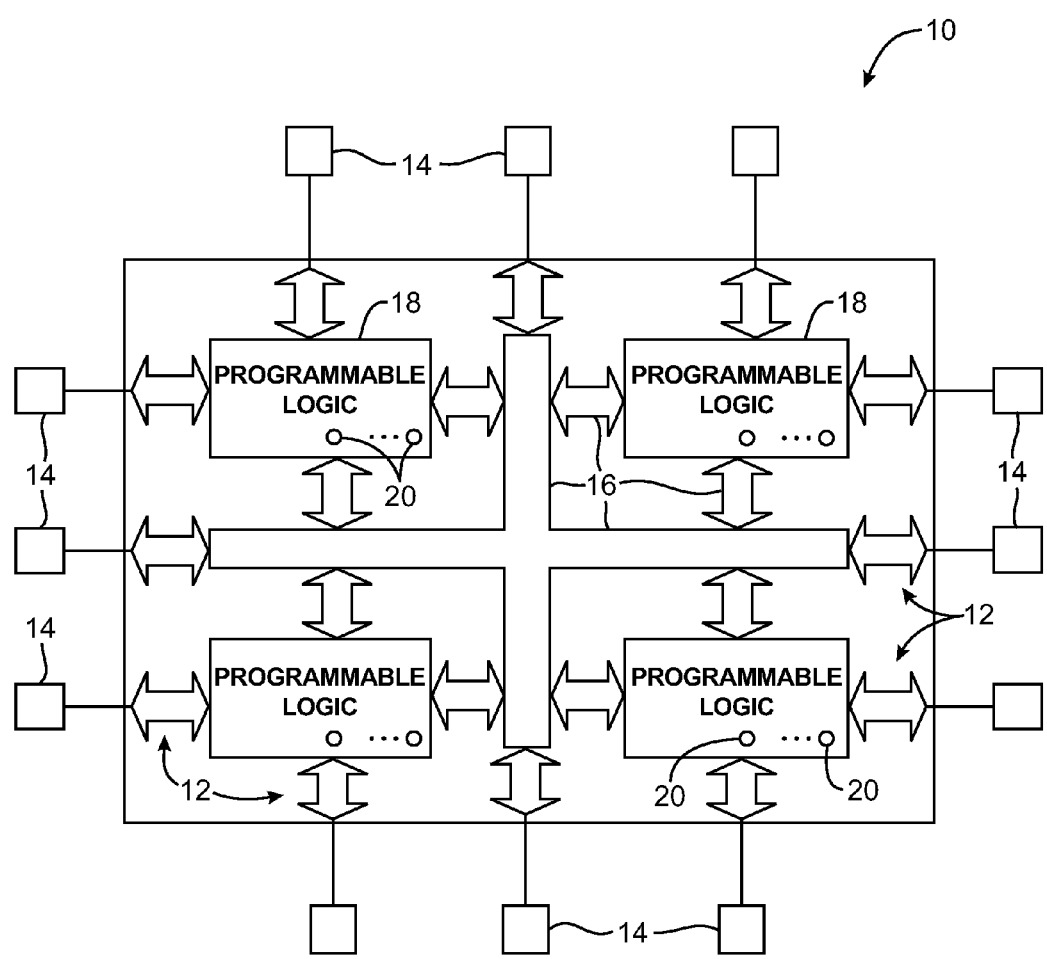
FIG. 1 is a diagram of an illustrative programmable logic device integrated circuit in accordance with an embodiment of the present invention.

An illustrative integrated circuit such as a programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include conductive lines and programmable connections between respective conductive lines and are therefore sometimes referred to as programmable interconnects 16.

Programmable logic 18 may include combinational and sequential logic circuitry. The programmable logic 18 may be configured to perform a custom logic function. The programmable interconnects 16 may be considered to be a type of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control signal that controls the operation of an associated logic component in programmable logic 18. In a typical scenario, the outputs of the loaded memory elements 20 are applied to the gates of metal-oxide-semiconductor transistors in programmable logic 18 to turn certain transistors on or off and thereby configure the logic in programmable logic 18 and routing paths. Programmable logic circuit elements that may be controlled in this way include parts of multiplexers (e.g., multiplexers used for forming routing paths in programmable interconnects 16), look-up tables, logic arrays, AND, OR, NAND, and NOR logic gates, pass gates, etc.

Memory elements 20 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 20 are loaded with configuration data during programming, memory elements 20 are sometimes referred to as configuration memory, configuration RAM, or programmable memory elements.

The circuitry of device 10 may be organized using any suitable architecture. As an example, the logic of programmable logic device 10 may be organized in a series of rows and columns of larger programmable logic regions each of which contains multiple smaller logic regions. The smaller regions may be, for example, regions of logic that are sometimes referred to as logic elements, each containing a look-up table, one or more registers, and programmable multiplexer circuitry. The larger regions may be, for example, logic array blocks containing multiple logic elements. In the example of FIG. 1, illustrative logic elements 22 are shown in one of the larger regions of programmable logic 18 in FIG. 1 (which may be a logic array block as an example). In a typical programmable logic device 10, there may be hundreds or thousands of logic elements 22. The four logic elements 22 that are shown in FIG. 1 are merely illustrative.

During device programming, configuration data is loaded into device 10 that configures the logic elements 22 so that each logic element performs a desired logic function on its inputs and produces corresponding output signals at one or more logic element outputs.

The resources of device 10 such as programmable logic 18 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic array blocks or other such logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Much of the logic circuitry on device 10 contains storage elements referred to as flip-flops. Flip-flops are edge triggered devices that can store digital data (e.g., a logic one or a logic zero).

Figure 2:
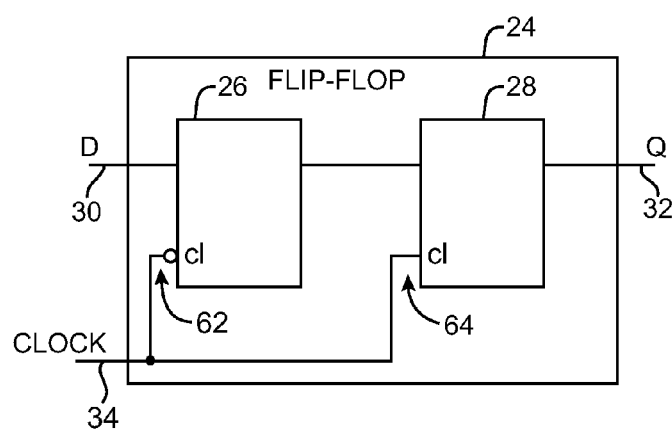
FIG. 2 is a diagram of a conventional flip-flop.

A conventional flip-flop 24 is shown in FIG. 2. Flip-flop 24 has a data input line 30 and a data output line 32. Level sensitive latches 26 and 28 are used to store data. Latches 26 and 28 are clocked by clock signal CLOCK at clock input line 34. Latch 26 has an inverting clock input 62. Latch 28 has a non-inverting clock input 64. Because input 62 is inverted with respect to input 64, latches 26 and 28 are effectively clocked with clock signals that are 180° out of phase. Latch 26 responds to an inverted clock signal and latch 28 responds to noninverted clock signal CLOCK.

Conventional flip-flops such as flip-flop 24 of FIG. 2 are characterized by a setup time Tsu, a hold time Th, and a clock-to-output time Tco.

The setup time Tsu of a flip-flop represents the minimum amount of time that data D on input line 30 must be valid before the signal CLOCK goes high on clock input 34 and its inverse goes low at the input 62 of latch 26. If data is presented to input 30 at a time that is closer in time to the clock edge than Tsu, proper operation of the flip-flop 24 cannot be guaranteed.

Figure 3:
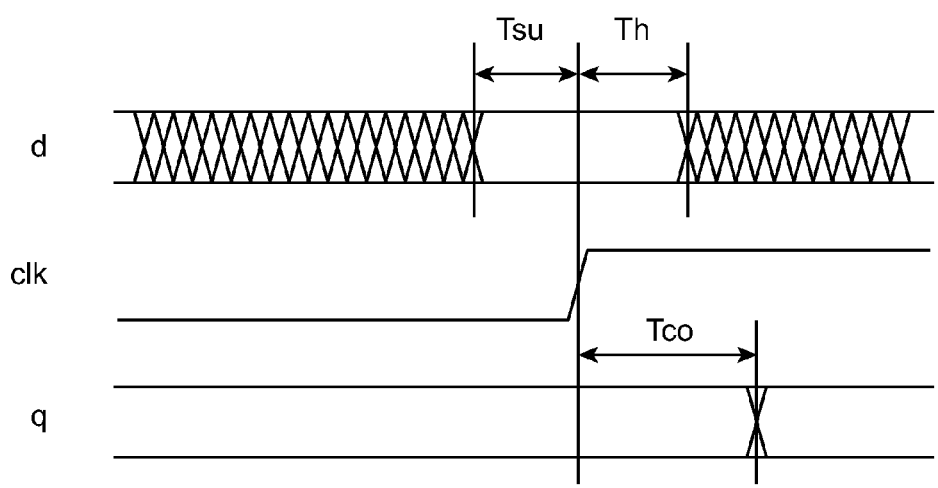
FIG. 3 is a timing diagram showing definitions for timing constraints in a configurable time borrowing flip-flop in accordance with an embodiment of the present invention.

The hold time Th relates to the behavior of latch 26 and represents the minimum amount of time that the data D is required to be stable after the CLOCK edge (i.e., after the inverse of CLOCK falls). If D changes state before Th is complete, the output Q of the flip-flop may not be correct. The clock-to-output time Tco represents the amount of time the flip-flop takes to change its output after the clock edge. These relationships are illustrated in the timing diagram of FIG. 3.

Although the data D that is presented to a flip-flop's input must be stable at least Tsu before the clock edge, there is no prohibition on data arriving at earlier times. The amount of time before the clock edge that stable data is presented at the input to a flip-flop may be referred to as Td. The variable Tcq is sometimes used to represent the amount of time after the edge of the clock signal CLK that output data Q is stable for a given value of Td. In some situations, data may be presented very close in time to the clock edge (e.g., close to or at the minimum established by the setup time Tsu). In this type of situation, Td will equal Tsu (or will be very close to Tsu). In other situations, data may be presented farther from the clock edge. In this type of situation, Td will be greater than Tsu.

The values of Td and Tcq are interrelated. The variable Td can be adjusted, while the variable Tcq is a function of Td. At Td values that are greater than or equal to Tsu, the flip-flop is expected to work properly, with a Tcq value of Tco (i.e., Tcq will be equal to the minimum amount of time required for the output to become valid after the clock edge—Tco). At Td values below Tsu, however, the setup time requirements of the flip-flop are violated because the data is arriving too close to the clock edge. In this situation, no valid data will be presented to the output of the flip-flop and the flip-flop will not perform properly.

With conventional flip-flops of the type shown in FIG. 2, time borrowing is not possible, which limits circuit performance. Consider, as an example, the illustrative circuit 74 of FIG. 4. In circuit 74, data is processed in a loop formed from flip-flop 76, logic circuit 78, flip-flop 80, and logic circuit 82.

Figure 4:
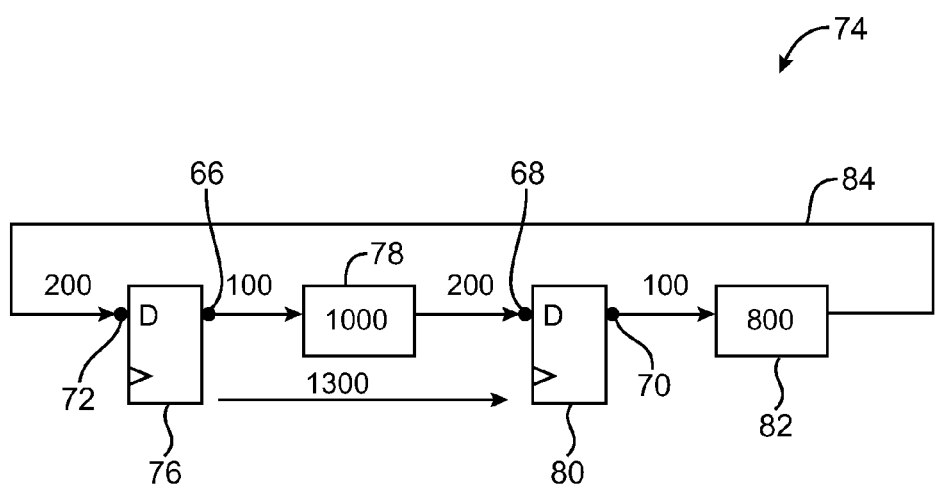
FIG. 4 is a diagram showing how a worst-case path in a circuit can limit clock frequency in conventional circuits.

In the example of FIG. 4, flip-flops 76 and 80 are conventional flip-flops without time borrowing capabilities. As a result, flip-flops 76 and 80 have fixed values of Tsu and Tco. In the FIG. 4 example, the value of Tsu for flip-flops 76 and 80 is 200 ps and the value of Tco for flip-flops 76 and 80 is 100 ps. As shown in FIG. 4, logic circuit 78 (in this example) has an associated processing delay of 1000 ps. Logic circuit 82 has an associated delay of 800 ps. Output signals from logic 82 are fed back to logic circuit 78 via feedback path 84.

In circuits such as circuit 74, the maximum clock frequency that can be used is dictated by the worst-case path delay. There are two relevant path delays to consider in circuit 74. The delay of the first path is associated with the path from point 66 to point 68. Note that although Tsu and Tco are associated with the internal logic of the flip-flop, they are considered to be part of the path in this discussion and are illustrated as being outside of the flip-flop. The delay of the first path is equal to 1300 ps (100 ps+1000 ps+200 ps). The delay of the second path is associated with the path from point 70 to point 72. This delay is equal to 1100 ps (100 ps+800 ps+200 ps). Because the delay associated with the slowest path is the limiting factor in determining the maximum clock speed, the maximum clock speed that can be used in clocking circuit 74 is governed by the path delay of 1300 ps that is associated with the path from point 66 to point 68. Even though the delay associated with the path from point 70 to point 72 is lower (1100 ps), this smaller delay cannot be exploited using conventional flip-flops. As a result, it is necessary to set the clock rate for circuit 74 to a frequency of about 1/(1300 ps) or 769 MHz.

In accordance with the present invention, pulse latches and other circuitry may serve as time borrowing flip flops. In arrangements in which time borrowing latch circuits (time-borrowing flip-flops) are used, circuit performance can be improved by reducing the delay associated with worst-case paths. Consider, as an example, the situation in which time-borrowing flip-flops are used in circuit 74.

Figure 5:
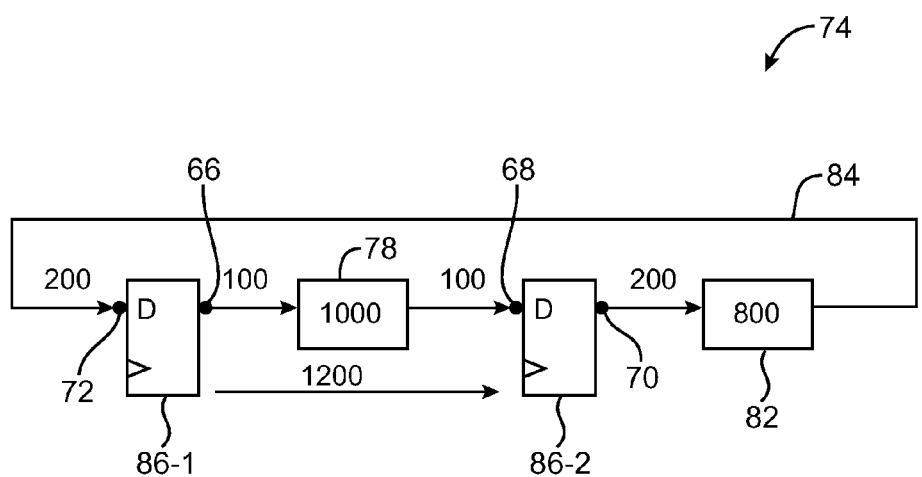
FIG. 5 is a diagram showing how the performance of a circuit of the type shown in FIG. 4 can be improved using configurable time borrowing flip-flops in accordance with an embodiment of the present invention.

The use of time-borrowing flip-flops allows the clock speed of illustrative circuit 74 of FIG. 4 to be increased. Consider, as an example, the arrangement of FIG. 5. In FIG. 5, circuit 74 is using configurable time-borrowing flip-flops 86-1 and 86-2 in place of conventional flip-flops 76 and 80 of FIG. 4. In the FIG. 5 example, flip-flop 86-1 is operated with a Tsu value of 200 ps and a Tco value of 100 ps, as with flip-flop 76 of FIG. 4. Flip-flop 86-2 of FIG. 5 operates with a Tsu value of 100 ps and a Tco value of 200 ps. Both flip-flop timing environments result in an identical Tdq value (300 ps). Nevertheless, operating flip-flop 86-2 with a Tsu value of 100 ps results in an improved balance for the delays associated with the paths in circuit 74.

In particular, the delay associated with the path between point 66 and 68 is reduced to 1200 ps (in the FIG. 5 arrangement) from 1300 ps (in the FIG. 4 arrangement), whereas the delay associated with the path between point 70 and 72 is increased to 1200 ps (in the FIG. 5 arrangement) from 1100 ps (in the FIG. 4 arrangement). Although one path is made slower than before, the other path is made faster and, on balance, the entire circuit 74 of FIG. 5 can operate more rapidly. This is because the maximum clock speed of the clock for circuit 74 is dictated by the worst case delay. In the example of FIG. 4, the maximum clock frequency for circuit 74 was 1/(1300 ps). In the example of FIG. 5, the maximum clock frequency for circuit 74 has been increased to 1/(1200 ps) or 833 MHz. This improvement in circuit performance is the result of time borrowing by flip-flop 86-2.

When configurable time-borrowing flip-flops are used, the amount of time borrowing that is associated with a given time borrowing flip flop may be adjusted by adjusting configurable delay elements associated with the flip-flops. The settings of the delay elements may, for example, configure the pulse width at the input to a pulse latch circuit that serves as a time-borrowing flip flop. Detailed knowledge of which portions of a circuit can tolerate larger delay element values and which portions of a circuit require relatively low delays can be provided using computer-aided design (CAD) circuit design tools.

Figure 6:
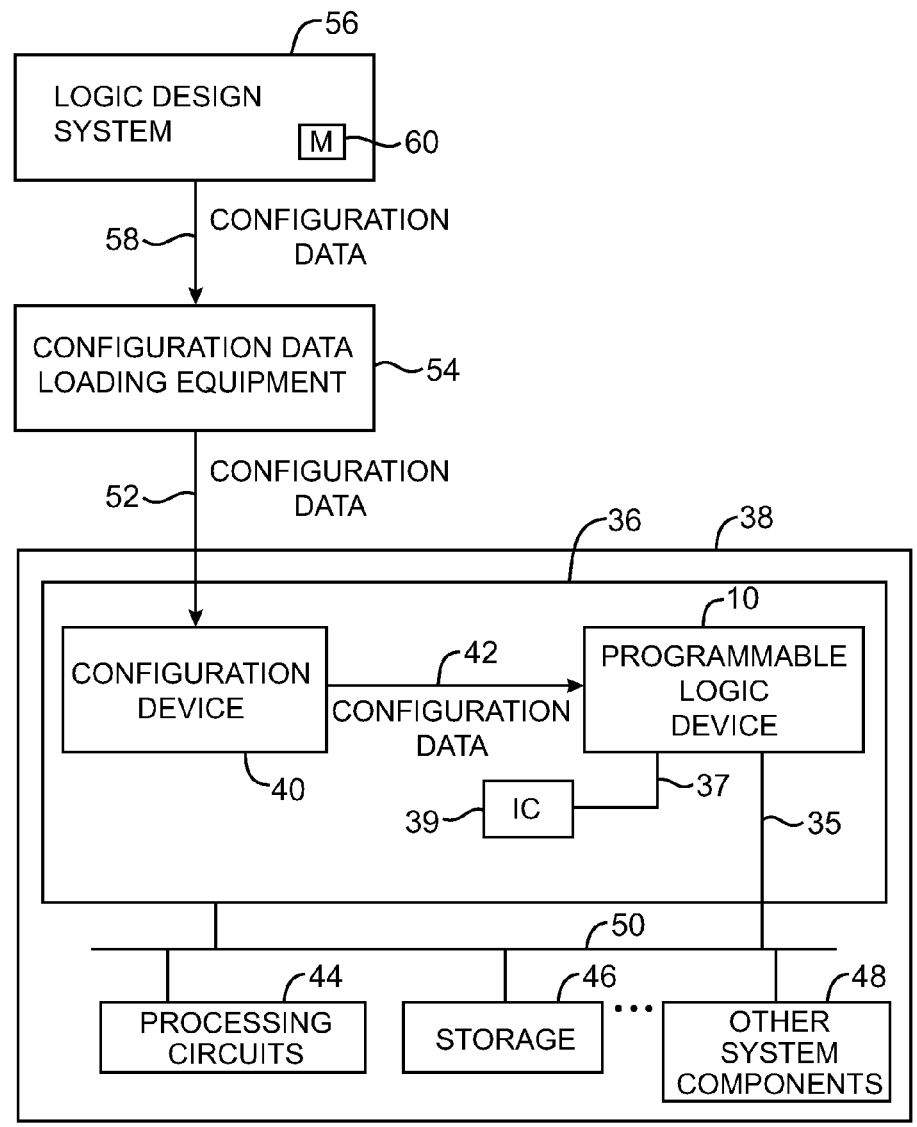
FIG. 6 is a diagram of an illustrative system environment in which a programmable circuit containing configurable time borrowing flip-flops may be used in accordance with an embodiment of the present invention.

An illustrative system environment for integrated circuits such as programmable integrated circuits that contain configurable time borrowing flip-flops is shown in FIG. 6. Programmable logic device 10 (or any other suitable integrated circuit containing time-borrowing flip-flop circuitry) may be mounted on a board 36 in a system 38. Programmable logic device 10 may receive configuration data from programming equipment or from any other suitable equipment or device.

In the example of FIG. 6, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be a programmable logic device configuration data loading chip that loads configuration data into programmable logic device memory from an external erasable-programmable read-only memory (EPROM) chip, a programmable logic device configuration data loading chip with built-in memory (sometimes referred to as a configuration device), or any other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings.

Communication paths may be used to interconnect device 10 to other components. For example, communication path 37 may be used to convey data between an integrated circuit 39 that is mounted on board 36 and programmable logic device 10. Communication paths 35 and 50 can be used to convey signals between programmable logic device 10 and components 44, 46, and 48.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 6, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 14.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into the programmable memory elements 20 of device 10. Device 10 may then be used in normal operation of system 38.

Figure 7:
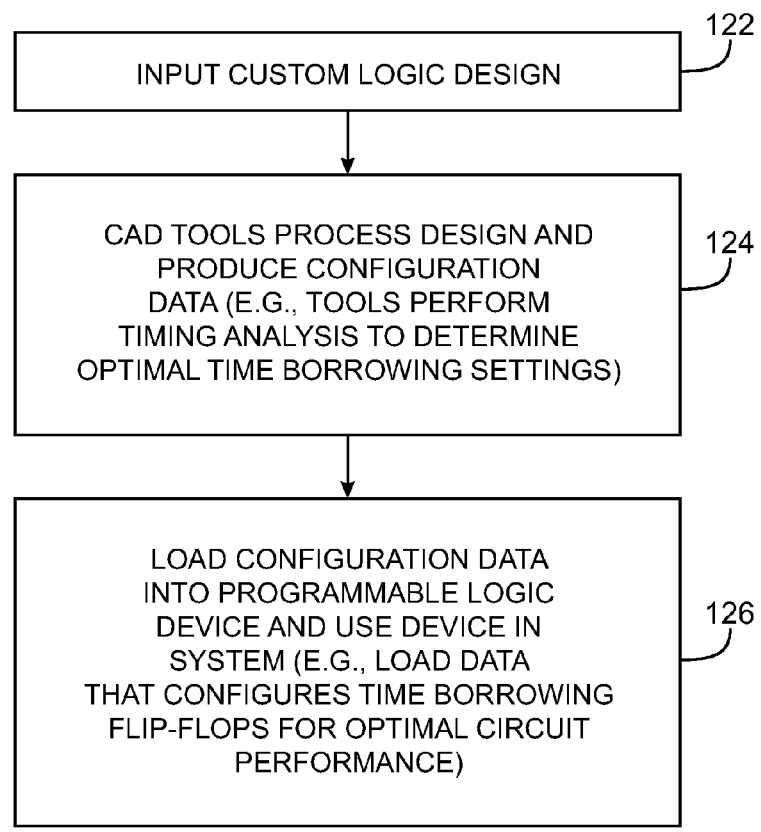
FIG. 7 is a flow chart of illustrative steps involved in designing and configuring a programmable circuit containing configurable time borrowing flip-flops in accordance with an embodiment of the present invention.

Illustrative steps involved in configuring and using a programmable logic device 10 that contains configurable time-borrowing flip-flops are shown in FIG. 7.

At step 122, a user (e.g., a logic designer) creates a custom logic design for a programmable logic device 10 using logic design system 56 (FIG. 6). The user provides computer aided design (CAD) tools on logic design system 56 (FIG. 6) with information on the custom logic design. The input data may be in the form of design data (e.g., specifications for a logic circuit or other circuit) and constraint data (e.g., settings that set limits on acceptable circuit performance and settings that control how the computer aided design tools 12 should process the designer's input). As an example, step 122 may involve the construction and entry of a logic circuit design to be implemented in a particular type of programmable logic device with certain size and timing constraints. The tools used to enter the logic circuit input data include tools such as text editors, floorplan editors, constraint editors, library-based and wizard-based design and constraint entry aids, etc. As another example, the design and constraint data entered at step 122 may relate to a circuit design that is to be implemented as an application specific integrated circuit (ASIC). In this context, a typical computer aided design tool 12 for accepting design and constraint data is a place-and-route tool. In general, any suitable format may be used for design and constraint data. Constraint data may include information on any suitable constraints (e.g., design object placement constraints, timing constraints, area constraints, noise level constraints, power consumption constraints, thermal constraints, etc.) Design and constraint data may be stored in databases on system 56 (storage 60).

At step 124, computer aided design tools on system 56 may be run to implement the circuit design. If, for example, the design is a logic design for a particular type of programmable logic device integrated circuit, CAD tools may be used to implement the logic design in a target technology. The CAD tools may include a logic compiler and other programs of the type that are typically provided as a suite of logic design and analysis tools. Programming data (e.g., in a .pof file) or other suitable output data representing the implemented design may be generated. If the design is a circuit design for an application specific integrated circuit, an application specific integrated circuit place-and-route tool and/or other suitable tools may be used to generate a series of lithographic mask specifications for fabricating the circuit as a silicon chip.

During step 124, analysis operations are performed using analysis tools such as timing analysis tools. The timing analysis performed during step 124 allows logic design system 56 to identify optimum time borrowing settings for each flip-flop and its configurable delay element circuitry. With one suitable arrangement, all flip-flops are first initialized to a minimum time borrowing setting. The timing analysis tools may then assign successively larger time borrowing settings. This process may be iterated until it converges. During a verification operation, the timing analysis tools can check that setup time constraints have been satisfied and that minimum expected data arrival times (for data signals D) do not violate the hold time requirements for any of the flip-flops. Once verification is complete, the CAD tools can increase the time borrowing setting for each flip-flop that cannot meet setup time constraints. The configuration data that is generated at step 124 includes configuration data for adjusting the configuration delay elements (pulse latch pulse generation circuitry) of each flip-flop to an appropriate setting.

Once an optimum implementation of the custom circuit design has been identified and configuration data for that design has been generated at step 124, the configuration data can be loaded into the programmable logic device 10 (step 126), as described in connection with FIG. 6. The loaded data configures the time borrowing flip-flops so that clock speeds can be made faster than would otherwise be possible.

If desired, time-borrowing flip-flops may be implemented using configurable pulsed latches. Configurable pulsed latch arrangements uses latching circuitry that is transparent (i.e., output tracking input) for a configurable amount of time Tsk to serve as a configurable time borrowing flip-flop.

Figure 8:
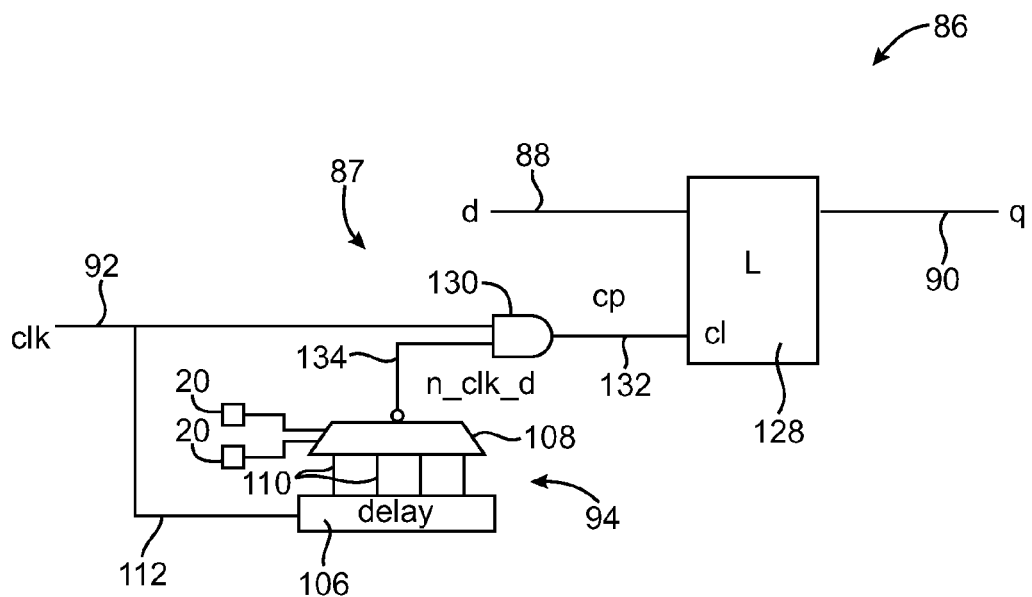
FIG. 8 is a diagram of a configurable time borrowing flip-flop based on a pulsed latch in accordance with an embodiment of the present invention.
Figure 9:
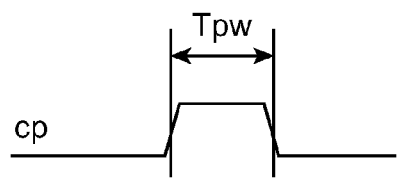
FIG. 9 is a diagram of an illustrative configurable-width clock pulse that may be generated in a circuit of the type shown in FIG. 8 in accordance with an embodiment of the present invention.

An illustrative embodiment of a configurable time borrowing flip-flop 86 based on a pulsed latch is shown in FIG. 8. Flip-flop 86 has a configurable pulse generation circuit 87 that is based on a configurable delay circuit 94. Clock signal CLK is provided on clock input line 92 and is distributed to delay element 106 via input 112. Delay element 106 produces four different delays (in this illustrative example). The clock signal on input 112 is therefore delayed by four corresponding amounts at the outputs 110 of delay element 106. Multiplexer 108, which is adjusted by the states of programmable elements 20, provides a selected one of the delayed versions of the clock signal on line 134 through an inverting output. Logic AND gate 130 receives the delayed clock signal on line 134 and the original clock signal CLK on line 92 and produces a pulse CP of an adjustable width Tpw on its output 132. The delayed clock signal on line 134 is inverted by the inverting output of multiplexer 108, which may be regarded as a phase delay of 180°. An illustrative clock pulse CP is shown in FIG. 9. The width Tpw is determined by the amount of delay selected by multiplexer 108.

The clock pulse CP is provided to the clock input CL of level-sensitive latch 128. Latch 128 receives data D from flip-flop input line 88 and produces corresponding output data Q on flip-flop output line 90. Using configurable pulse generation circuitry 87, the pulse width Tpw can be set to a value that maintains the latch 128 in its transparent state for a time appropriate to implement a desired amount of time borrowing.

It may be advantageous to use configurable time borrowing flip-flops in logic elements 22 (FIG. 1). A typical logic element may have a look-up table that supplies a data output to path 88 of flip-flop 86. If desired, data may be supplied to path 88 from other sources (e.g., from routing lines in a logic array block, etc.).

Pulse latches such as the pulse latch of FIG. 8 may allow time borrowing and thereby improve performance of a given logic circuit on a programmable logic device. However, short paths on a device may cause hold time issues. For example, short paths have the potential to lead to hold time violations in devices that have been fabricated under particular process conditions.

As described in connection with FIG. 8, each time-borrowing pulse latch circuit 86 may be implemented as a level sensitive latch to maximize speed. For proper operation of circuit 86 of FIG. 8, the pulse of FIG. 9 must be wide enough to latch data. However in some situations in which the pulse is wider than its minimum setting and the data path is faster than usual, a race through condition may arise. The race through hazard for pulse latches with short data path delay is illustrated in FIG. 10.

Figure 10:
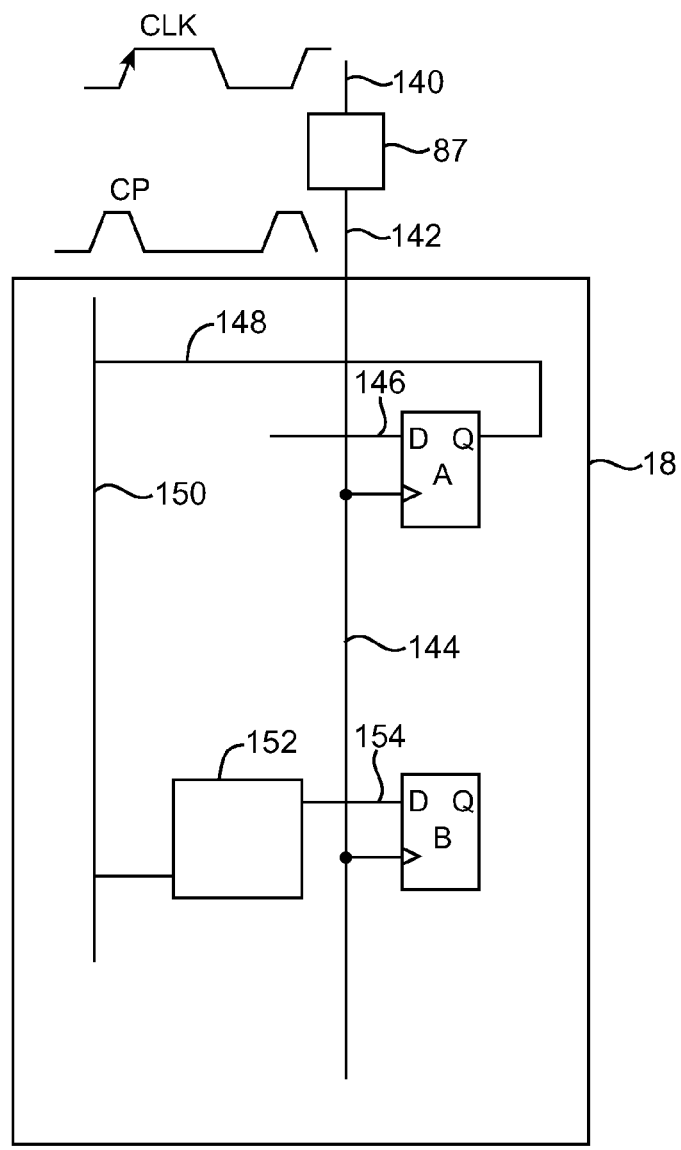
FIG. 10 is a diagram showing how there may be a potential for a race through condition to arise in a logic circuit when using a configurable time borrowing flip-flop in accordance with an embodiment of the present invention.

In FIG. 10, a clock signal CLK is provided to path 140. Delay circuit 87 produces a corresponding clock pulse CP on path 142. Clock pulse distribution path 144 may be used to distribute clock pulse CP to multiple time-borrowing flip flops (i.e., pulse latches A and B). Only low-to-high transitions on clock signal CLK create corresponding CP pulses, so latches A and B exhibit characteristics of positive edge triggered devices.

Each latch may be contained in a respective logic element (as an example). Latch A has a data input connected to input path 146. Latch B has a data input connected to input path 154. When clock pulse CP arrives at the clock input to latch A, latch A latches data signal D and transmits a corresponding output data signal Q through output path 148, through a short routing path such as local line 150, and through logic circuit 152 (e.g., a look-up table). Because path 148, local line 150, and logic circuit 152 produce only a small amount of delay, the output signal from latch A may be received at input 154 to latch B before the clock pulse CP ends. As a result, the data signal D at the input to latch B may be erroneously changing while pulse signal CP is high. If data signal D at the input to latch B were to transition only after CP had fallen, there would not be a race through condition and output Q of latch B would be valid. However, when CP is still high when the input D to latch B is changing, the output of latch A will affect latch B before the next cycle of clock signal CLK is reached. Circuits that exhibit race through in this way will not function properly and should be avoided.

In accordance with embodiments of the present invention, race through errors such as these can be avoided by providing a pulse generation circuit 87 that generates an appropriate minimum pulse width for clock pulse CP and by providing a fail-safe mode of operation in which the pulse latches can be operated as full edge-triggered flip-flops. Structures may also be provided that configurably reduce the skew between physically local but electrically distant parts of a clock distribution network.

Figure 11:
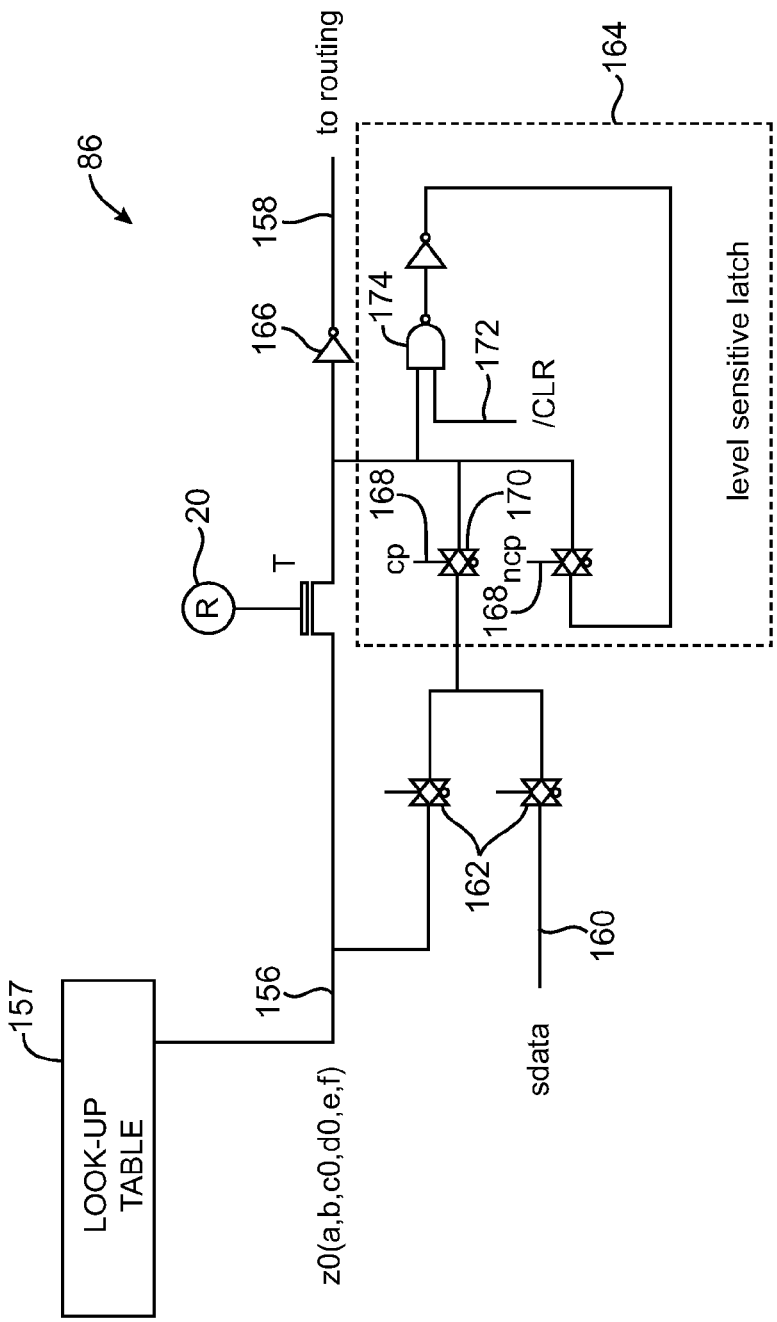
FIG. 11 is a diagram of a configurable time borrowing flip-flop based on a pulsed latch in accordance with an embodiment of the present invention.

An example of a suitable pulse latch that may be used to support configurable time borrowing functions in an integrated circuit such as programmable logic device integrated circuit 10 is shown in FIG. 11. As shown in FIG. 11, pulse latch 86 may have an input 156 that receives a logic signal. The logic signal that is received on input 156 may be, for example, a combinational function z0(a,b,c0,d0,e,f) from the output of look-up table 157 (as an example). If desired, pulse latch 86 may also receive a logic signal sdata on input path 160. Complementary metal-oxide-semiconductor (CMOS) pass gates 162 that are controlled by configuration random-access memory cells or dynamic control signals (e.g., control signals from core logic on device 10) may be used to selectively route signals from paths 156 and 160 into level sensitive latch 164.

If desired, pass transistor T may be turned on by suitable programming of an associated configuration random-access-memory cell 20. When pass transistor T is off, data may be routed into latch 164. When it is desired to bypass latch 164, latch 164 may be disabled and configuration random-access memory cell 20 may be used to turn transistor T on. In this configuration, data may be driven onto output 158 (and connected routing lines) via output buffer 166. Transistor T may be, for example, an n-channel metal-oxide-semiconductor pass gate formed using a thick oxide low power design. When transistor T is disabled and level sensitive latch 164 is enabled, pulse latch 86 may latch either z0(a,b,c0,d0,e,f) or sdata.

Pulse latch 86 may be clocked by a pulse generation circuit producing clock pulse CP and inverted clock pulse NCP. These clock pulse signals may be applied to terminals 168 of CMOS pass gates 170 as shown in FIG. 11. Line 172 at the input of NAND gate 174 may receive a clear control signal/CLR. This signal may be used to asynchronously clear pulse latch 86. When signal/CLR is low, latch 86 is placed in its normal pulse latch mode.

During normal operation, pulse latches such as latch 86 of FIG. 11 and other suitable pulse latch circuits may be controlled by pulses CP and NCP. In accordance with embodiments of the present invention, pulse generator circuitry may be provided that creates clock pulses CP and NCP in a way that avoids race through conditions. In particular, pulse generator circuitry may be provided that closely approximates the minimum delay permissible for clock pulses CP and NCP (i.e., the smallest clock pulse widths that will cause level sensitive latch 164 to correctly latch data during operation). In practice, the optimum pulse width that is produced by the pulse generator circuitry will tend to be slightly larger than the absolute minimum width required to latch data. This is because a small additional delay above the theoretical minimum pulse width helps to accommodate noise and on-die variations. Excess amounts of delay above this small additional delay will, however, increase the risk of race-through.

Figure 12:
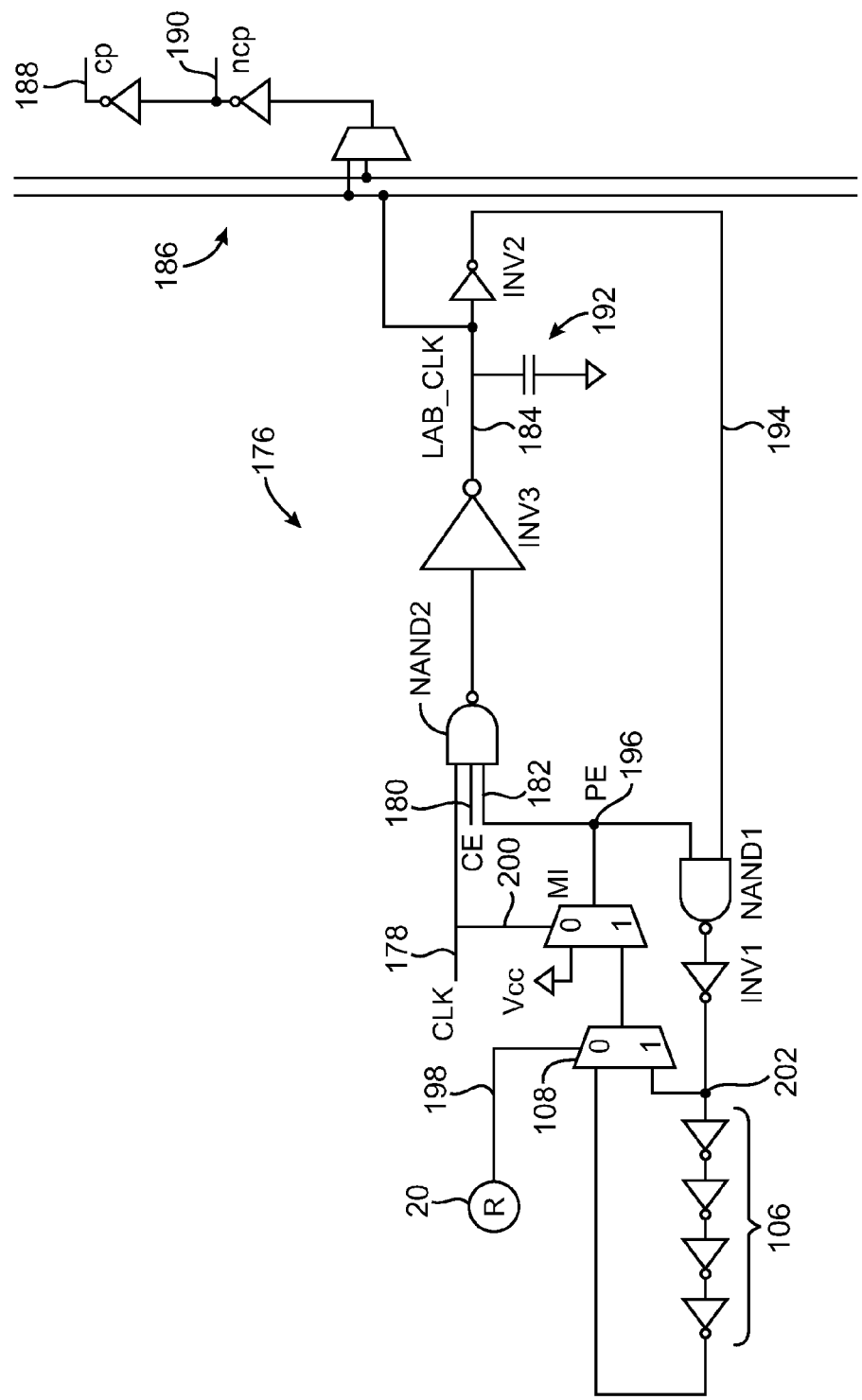
FIG. 12 is a diagram of a self timed pulse generator circuit that may be used to control time borrowing circuits of the type shown in FIG. 11 to reduce the potential for race through in accordance with an embodiment of the present invention.

Illustrative pulse generator circuitry 176 in accordance with the invention is shown in FIG. 12. In a typical arrangement, there may be one or two circuits such as circuit 176 per logic array block on device 10. This is, however, merely illustrative. If desired, there may be more circuits 176 or fewer circuits 176 on a given device.

Clock signal CLK may be received at input line 178 to NAND gate NAND2. The NAND gate NAND2 may also receive a clock enable signal CE and a pulse enable signal PE on respective inputs 180 and 182. The output of NAND gate NAND2 is connected to the input of inverter INV3. The output of inverter INV3 produces the clock pulse signal LAB_ CLK on path 184. As shown schematically by LAB line parasitic capacitance 192, there may be a nonnegligible amount of parasitic capacitance associated with driving path 184, as it may be used to drive many logic elements and flip-flops, only one of which is shown. As a result, inverter INV3 may be constructed using large transistors, as illustrated schematically in FIG. 12 by the relatively large size of inverter INV3.

The clock pulse signal LAB_CLK may be provided to the input of logic circuitry 186. Circuitry 186 may include optional multiplexer circuitry for allowing logic elements to select a desired LAB_CLK signal to use as its clock pulse CP or, following inversion, as its inverted clock pulse NCP. There may be, for example, two or more possible LAB_CLK signals in a given region of logic from which to choose (e.g., in multiclock architectures). Circuitry 186 may include inverter circuitry to use in producing inverted clock pulse NCP. As shown in FIG. 12, clock pulse signals CP and NCP may be provided at respective outputs 188 and 190 of logic 186.

The clock pulse signal LAB_CLK may be provided to the input of inverter INV2. Output signals from inverter INV2 may be routed to one of the two inputs to NAND gate NAND1. The other input of NAND gate NAND1 may receive signal PE from node 196. A configurable amount of delay may be provided using one or more delay elements such as delay element 106. In the example of FIG. 12, delay element 106 is formed from multiple series-connected inverters. Multiplexer 108 may be controlled by the configuration data loaded into an associated configuration random-access memory cell 20. The output from cell 20 may be supplied to the control input of multiplexer 108 over path 198. Multiplexer 108 has two inputs, so the illustrative pulse generation circuit 176 of FIG. 12 has two delay settings (high and low). In general, any suitable number of delay settings may be provided. (In the example of FIG. 8, delay circuit 94 has four associated delay settings.)

Multiplexer M1 receives the output of multiplexer 108 at its "1" input and receives positive power supply voltage Vcc at its "0" input. The output of multiplexer M1 is provided to node 196. Multiplexer M1 has a control input 200 that determines its state. Control input 200 is connected to line 178 and receives clock signal CLK. When clock CLK is high, the output of multiplexer 108 is routed to node 196. When clock CLK is low, multiplexer M1 is configured to route the high voltage on its "0" input to node 196.

When race through is not a problem in a given circuit, a logic designer may load configuration random-access-memory cell 20 of FIG. 12 with a logic zero. This switches the delay of delay element 106 into use and makes the time borrowing feature of pulse latch 86 (FIG. 11) active. If desired, additional levels of pulse delay adjustment may be provided (e.g., by using a multiplexer 108 with more inputs).

When race through is a problem in a given circuit, a logic designer will opt not to use time borrowing and will load configuration random-access-memory cell 20 of FIG. 12 with a logic one. In this situation, the clock pulses CP and NCP that are produced by circuit 176 will have the minimum width suitable for operating latch 86 (FIG. 11) satisfactorily. The characteristics of NAND gate NAND1, inverter INV1, and multiplexer 108 are preferably chosen to replicate as closely as possible the delay of pulse latch 86 (FIG. 11), so circuit 176 may be said to be "self-timed."

The operation of circuit 176 when no time borrowing is being used may be understood as follows. Initially, clock signal CLK is low, so multiplexer M1 routes the high voltage on its "0" input to node 196. This takes signal PE high. Clock enable signal CE is initially high. Because CLK is low, the output of NAND gate NAND2 is high. With the output of NAND gate NAND2 high, the output of inverter INV3 (i.e., clock pulse signal LAB_CLK) is low (as is associated signal CP). With LAB_CLK low, the output of inverter INV2 is high. Because signal PE is high and the output of inverter INV2 is high, both inputs to NAND gate NAND1 are high. As a result, the output of NAND gate NAND1 is low. Inverter INV1 inverts the low output from NAND gate NAND1 and produces a high signal at its output (node 202). No time borrowing is being used, so configuration random-access-memory cell 20 of FIG. 12 is loaded with a logic one and directs multiplexer 108 to connect its "1" input to its output. Because clock CLK is low, the control input to multiplexer M1 on line 200 is low and multiplexer M1 connects the high signal on its "0" input to node 196, maintaining signal PE at its high value.

When clock signal CLK transitions from low to high, the control input to multiplexer M1 on line 200 goes high. As a result, multiplexer M1 switches to its "1" input and passes the high input from the output of inverter INV1 at M1's "1" input to its output. There is thus no immediate change in the state of signal PE.

At this stage, clock enable signal CE is high and signal PE is high. Accordingly, the output of NAND gate NAND2 goes low when clock signal CLK goes high. Inverter INV3 inverts the low signal at the output of NAND2 and produces a high LAB_CLK signal. Inverter INV2 inverts this high signal, so that the output of inverter INV2 goes low. NAND gate NAND1 has a high input from signal PE. When NAND gate NAND1 receives the low signal from inverter INV2, the output of NAND gate NAND1 goes high. Inverter INV1 receives the high output from NAND gate NAND1 and takes its output low. Because the output of the configuration random-access-memory cell on line 198 is high, the low output of inverter INV1 passes through the "1" input of multiplexer 108 to the "1" input of multiplexer M1. Clock signal CLK is high, so multiplexer M1 is configured to route the low signal on its "1" input to node 196. This takes signal PE low.

Figure 17:
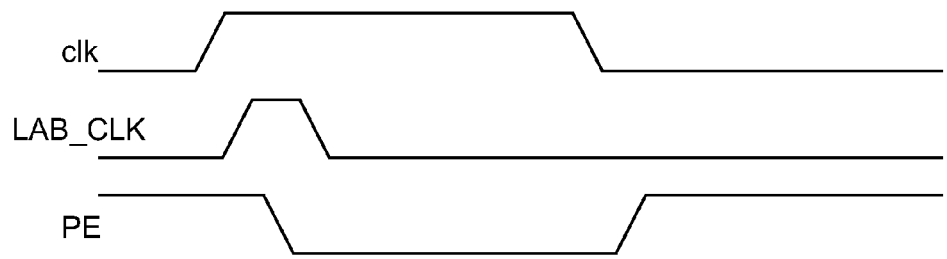
FIG. 17 is a timing diagram illustrating the behaviour of signals CLK, LAB_CLK, and PE in accordance with an embodiment of the present invention.

As a result of the operation of the pulse generation circuit, a signal PE is generated that is an inverted and delayed version of signal CLK and a pulse-shaped signal LAB_CLK is generated on path 184. Signal LAB_CLK goes high (after a short delay) whenever clock signal CLK has a rising edge and goes low (after a short delay) shortly after the rising edge of CLK, with a delay determined by the amount of time required for LAB_CLK to rise together with any additional delay from delay chain 106. Signal LAB_CLK (and signals CP and NCP which are true and complementary versions of LAB_CLK) therefore may be characterized by a pulse shape of the type shown in FIG. 9. A timing diagram illustrating the behaviour of signals CLK, LAB_CLK, and PE is shown in FIG. 17.

The design of pulse generation circuit 176 ensures that the width of pulse LAB_CLK (and the widths of associated pulses CP and NCP) can be as small as possible while being long enough to allow level sensitive latch 86 to operate properly. This is because NAND gate NAND1, inverter INV1, and multiplexer 108 of FIG. 12 create just enough delay to operate latch 86 (FIG. 11) properly.

The design of pulse generation circuit 176 also produces accurate pulses that are not subject to excessive changes due to fabrication process variations. If process variations are not well controlled, variations in the strength of inverter INV3 might adversely affect pulse width accuracy. However, the arrangement of pulse generation circuit 176 in FIG. 12 compensates for process variations. For example, if process variations cause inverter INV3 to be stronger than its nominal value, inverter INV3 will cause clock pulse LAB_CLK to rise too early. However, this will cause signal PE to reset to a low value early. The early transition of signal PE from high to low will cause the falling edge of clock pulse LAB_CLK to transition early to compensate. Similarly, if inverter INV3 is weak due to fabrication variations, the signal LAB_CLK will tend to rise slowly. This, in turn, will cause signal PE to transition later than usual and will cause LAB_CLK to fall later than usual. As a result of this compensating circuit behaviour, changes in the width of LAB_CLK (and pulses CP and NCP) due to integrated circuit manufacturing process variations are minimized.

Some integrated circuits are subject to potential race through conditions because of hold time problems arising from clock skew between latches. This type of situation may occur when latches are physically close to each other but are electrically far apart. The clock signals that feed the latches may develop skew. For example, two logic array blocks may be adjacent to each other, but may be located in different branches of a clock tree. The clock tree may be, for example, an H-shaped clock tree of the type sometimes referred to as an H-tree.

In integrated circuits such as programmable logic device integrated circuits, a number of H-trees may be provided to supply global clocks. Configurable multiplexers or other programmable routing circuits may be used to route the clock signals to desired locations within the trees. For example, a configurable multiplexer may be used to select among subset of the clocks at lower levels in a tree (e.g., to select a row clock (ROWCLK) in a programmable logic device).

In situations such as these, the relative delay in receiving data with two different latches might be small, but the clock skew between the two latches might be large. This can lead to an undesirable race through condition. To address clock skew of this type, integrated circuits (e.g., high speed circuits such as processors and programmable logic devices) may be provided with configurable clock tree shorting structures. The configurable clock tree shorting structures may be configured using memory elements such as memory elements 20.

Figure 13:
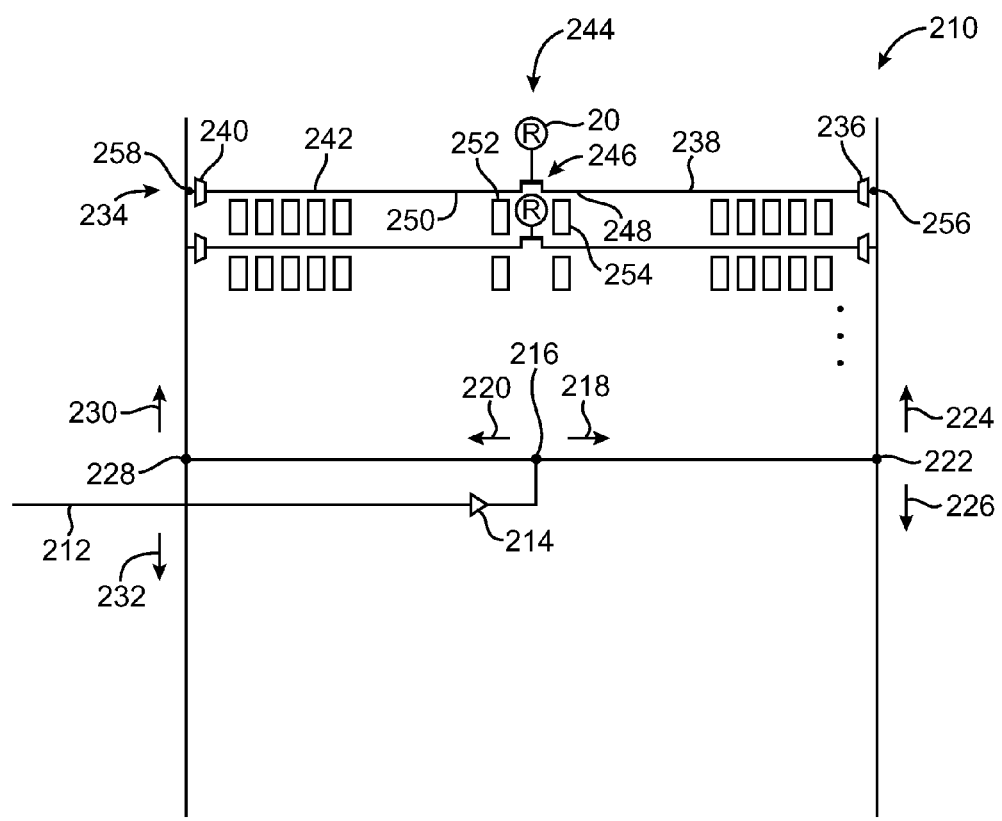
FIG. 13 is a diagram of a clock tree that may be used on an integrated circuit such as a programmable logic device integrated circuit to distribute clock signals in accordance with an embodiment of the present invention.

FIG. 13 shows an illustrative clock tree 210 with configurable clock tree shorting structures. As shown in FIG. 13, clock tree 210 may receive a clock from a clock source at an input such as input 212. Buffers such as buffer 214 may be used to drive the clock onto the conductors of clock tree 210. The clock tree is arranged to divide clock signals onto paths that are of relatively equal length. This helps to equalize the clock signal distribution path length that is experienced by circuits on the integrated circuit (e.g., on a programmable logic device 10). For example, at node 216, clock signals may be split onto a first path that conveys clock signals to node 228 in direction 220 and second path that conveys clock signals to node 222 in direction 218. At nodes 228 and 222, the clock signals are again split, giving rise to the H-clock shape of clock tree 210. In particular, at node 228, the clock signal may be split into a first path that conveys the clock in direction 230 and a second path that conveys the clock in direction 232 and at node 222 the clock signal may be split into a first path that conveys the clock in direction 224 and a second path that conveys the clock in direction 226.

The clock signal may be routed to logic circuits in rows such as row 234. Multiplexers or other suitable switching structures may be used to convey the clock onto the clock conductors of each row. In the example of FIG. 13, multiplexer 240 routes row clock signals onto left-hand path 242 and multiplexer 236 routes clock signals onto right-hand path 238.

The delay differences for the clock signal from input 212 at the center of a particular row may cause skew between the version of the clock on the left half of the row and the version of the clock on the right half of the row. To reduce or eliminate this skew, a logic designer can load programming data into appropriate memory elements 20. The outputs of these memory elements may be provided to the gates of NMOS pass transistors or other suitable configurable clock tree shorting structures. The configuration data in the memory elements may cause the pass transistors to selectively short various clock path conductors together. For example, a memory element 20 may produce a control signal on its output (e.g., a logic high) that turns on transistor 246 and thereby shorts lines 242 and 248 together in row 234. This reduces clock skew between regions of logic such as logic elements 252 and 254, so that logic elements 252 and 254 function properly at high clock frequencies.

The low resistance connection between respective branches of an H-tree or other clock distribution network that is provided by transistors such as transistor 246 is preferably generated when the branches are being used to convey respective versions of the same clock signal (e.g., a clock signal CL). In a programmable logic device integrated circuit or other integrated circuit with configurable clocking structures, two clock tree branches may sometimes be used to convey distinct signals. In this situation, the memory element 20 for the appropriate configurable clock tree shorting structure (e.g., transistor 246 in the FIG. 13 example) may sometimes be used to produce a control signal that configures the configurable clock tree shorting structure to produce an open circuit between its terminals. For example, transistor 246 may be turned off so that an open circuit is produced between its respective source-drain terminals. Shorting structures such as transistor 246 are preferably only used to short clock paths together when the clock paths carry the same clock signal.

The configurable shorting connections are preferably arranged such that any time the same clock signal is routed to circuits with potentially large clock skew (i.e., potentially large clock skew LABs), a configurable shorting connection can be enabled. With one suitable technique, a configurable shorting connection is provided between every possible pair of row clocks (rowclks) on the left and right of a circuit.

A less complex arrangement involves ensuring that every clock in the clock tree (e.g., the H-tree) can be routed onto every row as a rowclk. With this arrangement, it may be possible to guarantee that those clocks that are used on both the left and right can be routed onto the clock paths in a row that have available shorting structures. Only a single configurable shorting connection need be provided in each row in this type of configuration.

As an example, if there were six rowclks in a given device and it was necessary to provide a connection between every possible pair between the left and right branch, 21 connections might be required. If sufficient routing flexibility is provided, whenever a clock is used on both left and right, it will use the same rowclk. In this situation, only six connections need to be provided. As this example demonstrates, flexible clock routing arrangements tend to reduce the number of configurable clock tree shorting connections that are required (e.g., from 21 to 6), but may increase the required capacity for the H-tree to rowclk multiplexers such as multiplexers 240 and 236 of FIG. 13.

If desired, conventional buffers may be used to drive the rowclks (i.e., the clocks on paths such as paths 242 and 238). However, this type of arrangement may lead to some short circuit current if there is a period when an early rowclk that is driving a different value onto a row than a late rowclk. To avoid contention of this type, it may be desirable to use low contention buffers when driving clocks onto the clock paths that are to be selectively shorted together. Possible locations for the clock distribution buffers are indicated by nodes 256 and 258 (as an example). Clock distribution buffers (drivers) may be located at any suitable locations within clock tree 210 if desired.

Figure 14:
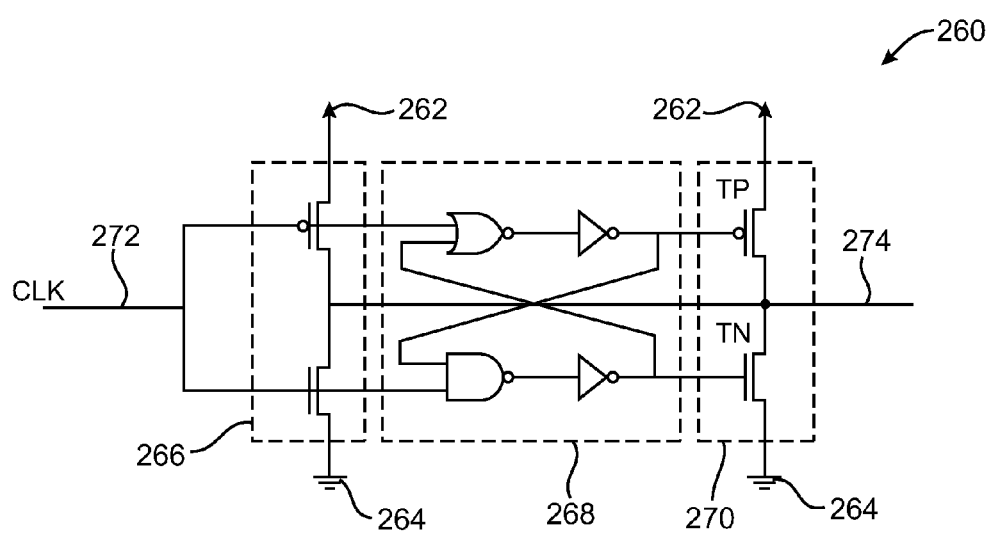
FIG. 14 is a diagram of a clock driver circuit of the type that may be used to drive clock signals onto clock paths such as the clock row paths of FIG. 13 in accordance with an embodiment of the present invention.

A low-contention clock distribution driver may include driving transistors with fast disable and delayed enable characteristics. An illustrative circuit for this type of low-contention clock driver is shown in FIG. 14. As shown in FIG. 14, clock driver 260 may have parallel inverters 266 and 270. A clock signal CLK may be received at input 272 and a corresponding strengthened version of the clock signal may be provided at output 274. In a typical scenario, output 274 may be connected to a clock distribution path such as one of the row paths in FIG. 13 (as an example). In this type of environment, the low contention capabilities of driver 260 are used to prevent short circuit currents from developing in those rows in which the left and right halves of the clock distribution path have been shorted together using a pass transistor such as pass transistor 246. In general, however, driver 260 may be connected in any suitable portion of a clock distribution network on an integrated circuit.

Inverters 266 and 270 (sometimes referred to as buffers, drivers, drive circuitry, etc.) have their outputs connected to output line 274. A positive power supply voltage (e.g., Vcc) may be applied to positive power supply lines 262 and a ground power supply voltage (e.g., Vss of 0 volts) may be applied to ground power supply terminals 264. Inverter 266 may be driven directly from clock signal input line 272. Inverter 270 may be driven by a version of the clock signal that has passed through pulse generation circuitry 268.

The strengths of inverters 266 and 270 are preferably such that inverter 266 is weaker than inverter 270. The relative strengths of inverters 266 and 270 may be adjusted by selecting appropriate transistor gate widths for the n-channel and p-channel metal-oxide-semiconductor transistors in inverters 266 and 270. For example, inverter 270 may be configured to be stronger than inverter 266 by forming inverter 270 from transistors with larger gate widths than the transistors used in inverter 266.

Figure 18:
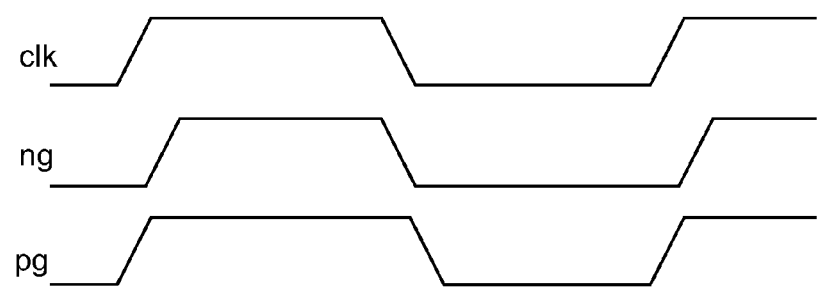
FIG. 18 is a timing diagram showing the relationship between signal CLK and other signals in an illustrative timing circuit for a low contention clock driver in accordance with an embodiment of the present invention.

Inverter 266 serves as a weak sustainer that weakly drives a clock path to its desired value. Because of the presence of timing circuitry 268, inverter 270 exhibits a slow turn on characteristic and a fast turn off characteristic. As a result, during both rising and falling clock transitions, one inverter transistor is turned off before the other inverter transistor is turned on. This temporarily weakens the strength of the clock driver 260 and prevents contention with a corresponding clock driver that is driving nominally identical clock signals onto the other end of a shorted clock path. A timing diagram showing the relationship between signal CLK on input line 272, signal ng (the signal on the gate of transistor TN), and pg (the signal on the gate of transistor TP) is shown in FIG. 18.

The example of FIG. 14 is merely illustrative. In general, any suitable low-contention clock drivers may be used when driving clocks onto clock paths such as paths 242 and 238 of FIG. 13. When two low-contention drivers are connected to a single path, but are driven by inputs with slightly different delays, the driver that first receives the clock signal will tend to drive the path to the new value while the driver that last receives the clock signal will still be disabled for a short time. This avoids contention currents between the two drivers.

As described in connection with FIG. 10, pulse latch robustness is adversely affected by race through. Race through conditions arise when the time from clock to out (Tco) in a source latch and the propagation delay through any intervening combinational logic is smaller than the required amount of time that the data must be stable after the clock at a destination latch, referred to as hold time (Th). There is thus a race through problem when Tco+Tpd<Th. This problem may be addressed either by increasing the magnitude of Tco or decreasing the magnitude of Th. In doing so in a pulse latch configuration, care should be taken to preserve the high speed of the pulse latches. This may be accomplished by allowing a logic designer to selectively increase Tco only when there is a danger of race through.

Figure 15:
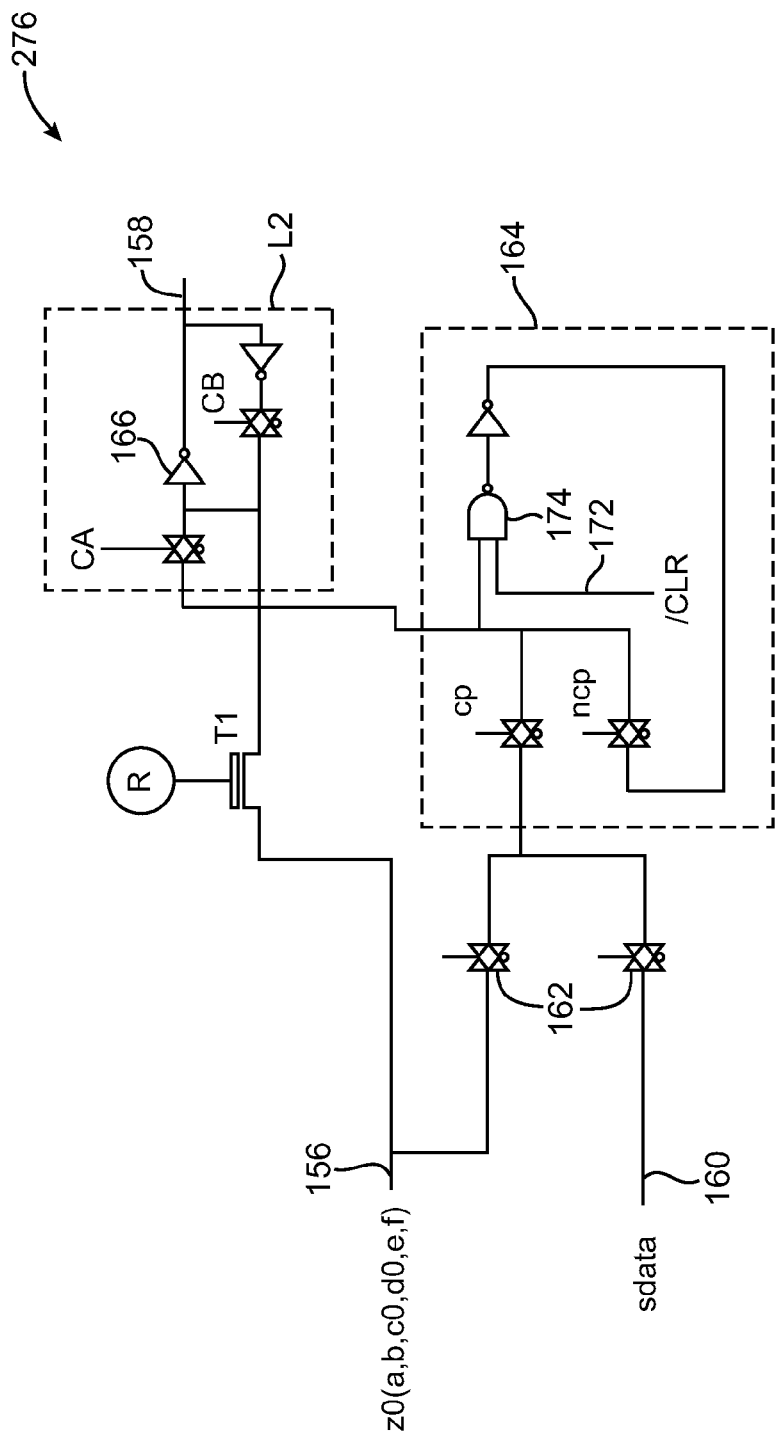
FIGS. 15 and 16 are diagrams of illustrative pulse latch circuits that may be selectively configured as edge triggered flip-flops in accordance with an embodiment of the present invention.

In accordance with embodiments of the present invention, Tco may be increased by selectively adding a secondary latch circuit (e.g., by selectively adding a negative phase latch on the output path of a given pulse latch). An arrangement of this type is shown as pulse latch circuit 276 of FIG. 15. As shown in FIG. 15, latch circuit 276 may have level sensitive latch 164 and a secondary selectively enabled latch L2. With one suitable arrangement, circuit 276 of FIG. 15 may be connected in parallel with circuit 86 of FIG. 11 (i.e., a circuit 276 and a circuit 86 may both be connected to the same logic outputs such as a common look-up table output and a common sdata line). In this type of arrangement, a given logic element may have two distinct outputs, one of which is associated with a latch circuit of the type shown in FIG. 15 and one of which is associated with the latch circuit of the type shown in FIG. 11. If desired, circuits such as the circuits of FIGS. 11 and 15 may be used separately on an integrated circuit.

Circuit 276 may be configured as either a pulse latch (by disabling latch L2 by appropriate programming of device 10) or an edge-triggered flip-flop (by enabling latch L2 by appropriate programming of device 10). The state of pass transistor T1 may be controlled by the output of a corresponding programmable memory element 20. By loading suitable configuration data into the memory element, transistor T1 may be turned off or on as desired.

Circuit 276 may be operated in three different modes.

In a first mode, circuit 276 may be configured to operate as a pulse latch. In this mode, control signal CA will be high, control signal CB will be low, and transistor T1 will be turned off. This disables latch L2. Output signals from latch 164 will be routed through output buffer 166 to output line 158 without being influenced by the latching operation of latch circuit L2.

In a second mode, circuit 276 may be operated as an edge triggered flip flop by enabling latch L2. In this mode, control signal CA will be inverted clock pulse NCP, control signal CB will be clock pulse CP, and pass gate T1 will be off. Because there are two active latches in circuit 276 in this configuration, circuit 276 serves as an edge triggered flip flop and eliminates the risk of race through conditions developing on the integrated circuit.

In a third mode, circuit 276 operates as a combinatorial circuit. In this situation, latch L2 is disabled by taking control signals CA and CB low. Transistor T1 is turned on to bypass latch L1. In this configuration, combinatorial signals from input line 156 may be routed to output 158.

Figure 16:
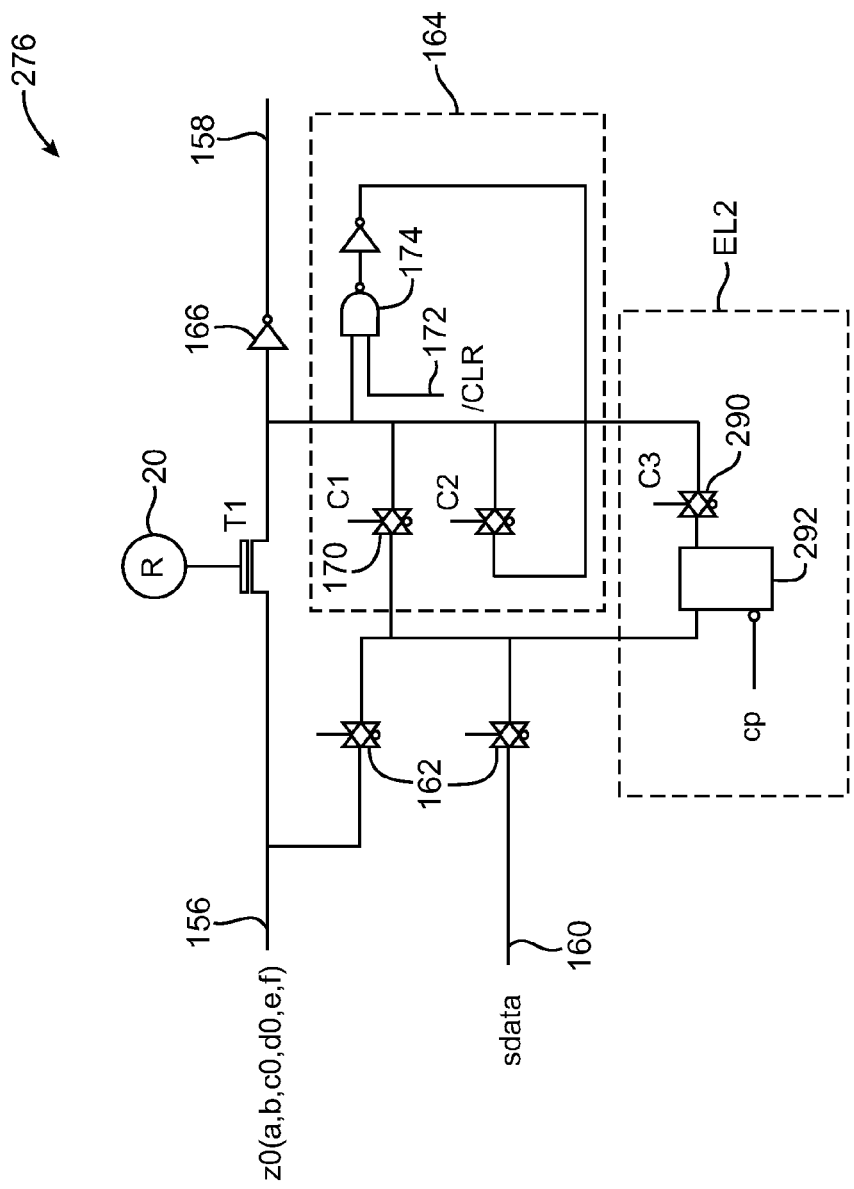

If desired, selectively enabled secondary latching circuitry may be added to circuitry 276 at a location that is upstream from latch 164, rather than downstream. This type of configuration is shown in FIG. 16. As shown in FIG. 16, latch circuitry 276 may have secondary latch circuit 292 in circuitry EL2, which serves as a secondary negative phase latch when it is desired to reduce the risk of race through conditions. Latch circuit 292 may be based on a level sensitive latch with an inverting clock pulse input. A separate pass gate 290 can be provided to couple the output of latch 292 into the input of pulse latch 164. As with latch circuitry 276 of FIG. 15, latch circuitry 276 of FIG. 16 may be operated in three modes.

In a first mode, circuit 276 operates as a pulse latch. In this mode of operation, clock pulse CP may be used as pass gate control signal C1 and inverted clock pulse NCP may be used as pass gate control signal C2 in latch 164. The control signal C3 for pass gate 290 may be set to a low value, so that latch EL2 is disabled. Pass transistor T1 may be turned off, so that signals are routed through latch 164 to output 158.

In a second mode, circuit 276 operates as an edge-triggered flip flop. In this configuration, pass transistor R1 may be turned off. Control signal C1 may be set to a low value to disable pass gate 170. Control signal C2 may be provided with inverted clock pulse NCP and control signal C3 may be provided with clock pulse CP. This enables latch 292, so that signals are routed from input 156 (or input 160) through both EL2 and latch 164 to output 158. Because circuit 276 operates as an edge-triggered flip flop in this mode, the risk of race through conditions is eliminated.

In the third mode, latch circuit 276 is configured to operate as a combinatorial circuit. In this mode, control signals C1, C2, and C3 are low to disable latch EL2 and latch 164. Transistor T1 is turned on, so that combinatorial signals from input 156 may bypass both latches and may pass to output 158 through buffer 166.

The foregoing is merely illustrative of the principles of this invention and various modifications can be made by those skilled in the art without departing from the scope and spirit of the invention.

What is claimed is:

1. Circuitry on an integrated circuit, comprising:
a pulse latch formed from a level sensitive latch that receives at least one clock pulse of a given pulse width; and
pulse generation circuitry that generates the at least one clock pulse, wherein the pulse generation circuitry includes an input that receives a clock signal, an output at which the clock pulse is provided, and logic circuitry with which signals from the output are fed back and combined with the clock signal, wherein the given pulse width comprises an adjustable pulse width, and wherein the pulse generation circuitry includes a configurable delay element.

2. The circuitry defined in claim 1, wherein the logic circuitry includes a NAND gate.

3. Circuitry on an integrated circuit, comprising:
a pulse latch formed from a level sensitive latch that receives at least one clock pulse of a given width; and
pulse generation circuitry that generates the at least one clock pulse, wherein the pulse generation circuitry includes an input that receives a clock signal, an output at which the clock pulse is provided, and logic circuitry with which signals from the output are fed back and combined with the clock signal, wherein the logic circuitry includes a feedback path and at least one NAND gate in the feedback path and wherein the pulse generation circuitry includes a configurable delay element.

4. The circuitry defined in claim 3, wherein the given pulse width comprise an adjustable pulse width.

5. The circuitry defined in claim 3, further comprising at least one programmable element, wherein the at least one programmable element provides a static control signal to the configurable delay element.

6. Circuitry on an integrated circuit, comprising:
a pulse latch formed from a level sensitive latch that receives at least one clock pulse of a given width; and
pulse generation circuitry that generates the at least one clock pulse, wherein the pulse generation circuitry includes an input that receives a clock signal, an output at which the clock pulse is provided, and logic circuitry with which signals from the output are fed back and combined with the clock signal, wherein the logic circuitry comprises a feedback path coupled to the output, a delay element, and a configurable multiplexer that selectively includes the delay element in the feedback path.

7. The circuitry defined in claim 6, wherein the delay element comprises a plurality of series-connected inverters.

8. The circuitry defined in claim 6, further comprising at least one programmable element that provides a static control signal to the configurable multiplexer.

9. Circuitry on an integrated circuit, comprising:
a pulse latch formed from a level sensitive latch that receives at least one clock pulse of a given width; and
pulse generation circuitry that generates the at least one clock pulse, wherein the pulse generation circuitry includes an input that receives a clock signal, an output at which the clock pulse is provided, and logic circuitry with which signals from the output are fed back and combined with the clock signal, wherein the pulse generation circuitry includes a NAND gate that receives the clock signal and the fed back signals from the output, wherein the pulse generation circuitry includes a configurable delay element having at least two delay settings.

10. The circuitry defined in claim 9 wherein the clock pulse has a pulse width, wherein the fed back signals are fed back along a feedback path, and wherein the circuitry includes a NAND gate in the feedback path that serves at least partly to establish the pulse width.

11. The circuitry defined in claim 9 wherein the clock pulse has a pulse width, wherein the fed back signals are fed back along a feedback path, wherein the circuitry includes a NAND gate in the feedback path, and wherein the configurable delay element comprises:
a delay element; and
a first multiplexer that configurably connects the delay element into the feedback path, wherein the NAND gate and the first multiplexer serve at least partly to establish the pulse width when the delay element is not connected into the feedback path.

12. The circuitry defined in claim 11 further comprising a second multiplexer in the feedback path, wherein the second multiplexer has a control input that is controlled by the clock signal at the input.

13. The circuitry defined in claim 9, wherein the given pulse width comprises an adjustable pulse width.

14. The circuitry defined in claim 9, wherein the configurable delay element includes a multiplexer.

15. Circuitry on an integrated circuit, comprising:
a pulse latch formed from a level sensitive latch that receives at least one clock pulse of a given pulse width; and
pulse generation circuitry that generates the at least one clock pulse, wherein the pulse generation circuitry includes an input that receives a clock signal, an output at which the clock pulse is provided, and logic circuitry with which signals from the output are fed back and combined with the clock signal, wherein the given pulse width comprises an adjustable pulse width, and wherein the logic circuitry includes at least first and second NAND gates.

16. The circuitry defined in claim 15, wherein the first NAND gate receives the clock signal.

17. The circuitry defined in claim 16, further comprising a configurable delay element.

18. Circuitry on an integrated circuit, comprising:
a pulse latch formed from a level sensitive latch that receives at least one clock pulse of a given pulse width; and
pulse generation circuitry that generates the at least one clock pulse, wherein the pulse generation circuitry includes an input that receives a clock signal, an output at which the clock pulse is provided, and logic circuitry with which signals from the output are fed back and combined with the clock signal, wherein the given pulse width comprises an adjustable pulse width, and wherein the fed back signals are fed back along a feedback path, and wherein the circuitry further comprises:
a first NAND gate that receives the clock signal; and
a second NAND gate in the feedback path.

* * * * *